US012568591B2

(12) United States Patent
Maurech et al.

(10) Patent No.:  US 12,568,591 B2
(45) Date of Patent:       Mar. 3, 2026

(54) ELECTRONIC CASING COMPRISING ELECTRONIC BOARDS

(71) Applicant: SAGEMCOM BROADBAND SAS, Bois-Colombes (FR)

(72) Inventors: Cécile Maurech, Bois-Colombes (FR); Mikaël Hardy, Bois-Colombes (FR); Jean-Philippe Jaulin, Bois-Colombes (FR)

(73) Assignee: SAGEMCOM BROADBAND SAS, Bois-Colombes (FR)

( * ) Notice: Subject to any disclaimer, the term of this patent is extended or adjusted under 35 U.S.C. 154(b) by 83 days.

(21) Appl. No.: 18/545,516

(22) Filed: Dec. 19, 2023

(65) Prior Publication Data

US 2024/0206088 A1     Jun. 20, 2024

(30) Foreign Application Priority Data

Dec. 20, 2022     (FR) ...................................... 2213996

(51) Int. Cl.
*H05K 5/02*          (2006.01)
*H05K 7/20*          (2006.01)

(52) U.S. Cl.
CPC ....... *H05K 5/0213* (2013.01); *H05K 7/20145* (2013.01); *H05K 7/20154* (2013.01)

(58) Field of Classification Search
CPC .. H05K 5/0004; H05K 5/0052; H05K 5/0213; H05K 7/023; H05K 7/20; H05K 7/20127; H05K 7/20154; H05K 7/20254; H05K 7/20272; H05K 7/20281; H05K 7/20409;

H05K 7/20436; H05K 7/20509; H05K 7/20545; H05K 7/20618; H05K 7/20754; H05K 1/0201–0212; H05K 1/181–182; H01L 23/36; H01L 23/367; H01L 23/3672; H01L 23/3677; F21V 29/002; F21V 29/004; F21V 29/10; F21V 29/20; F21V 29/2212; G06F 1/20; G06F 1/203

See application file for complete search history.

(56) References Cited

U.S. PATENT DOCUMENTS

| | | | | |
|---|---|---|---|---|
| 6,400,566 | B1 * | 6/2002 | Ootori ....................... | G06F 1/20 |
| | | | | 257/E23.099 |
| 12,099,386 | B2 * | 9/2024 | Rohena ................... | H02H 5/04 |
| 2003/0081377 | A1 | 5/2003 | Lin | |
| 2008/0285224 | A1 * | 11/2008 | Odanaka ................... | G06F 1/20 |
| | | | | 361/679.48 |
| 2011/0058330 | A1 * | 3/2011 | Abraham .................. | G06F 1/20 |
| | | | | 361/679.54 |
| 2013/0028152 | A1 | 1/2013 | Kim et al. | |

(Continued)

*Primary Examiner* — Amir A Jalali
(74) *Attorney, Agent, or Firm* — MUNCY, GEISSLER, OLDS & LOWE, P.C.

(57)                    ABSTRACT

An electronic casing includes a box including a first part and a second part, each part forming a distinct container, such that a first electronic board is housed in the first part and such that a second electronic board is housed in the second part, the two parts being integral with one another by a conduit shaped to form an air circulation channel, the casing comprising at least one first connector linked to the first electronic board and at least one second connector linked to the second electronic board, the two connectors being in contact with one another through the conduit.

15 Claims, 8 Drawing Sheets

(56)                    References Cited

U.S. PATENT DOCUMENTS

| | | | |
|---|---|---|---|
| 2014/0211421 A1* | 7/2014 | Mishrikey | H05K 1/0209 |
| | | | 361/717 |
| 2017/0347498 A1* | 11/2017 | Janak | H05K 7/1488 |
| 2020/0119655 A1* | 4/2020 | Ichinose | H05K 1/0203 |
| 2020/0137926 A1* | 4/2020 | Wöhlte | H05K 7/20436 |
| 2023/0223314 A1* | 7/2023 | Yoshida | H01L 23/3672 |
| | | | 257/712 |
| 2024/0107706 A1* | 3/2024 | Lunsman | H05K 7/20272 |
| 2024/0379484 A1* | 11/2024 | Stegmeier | H01L 23/52 |

* cited by examiner

ELECTRONIC CASING COMPRISING ELECTRONIC BOARDS

The invention relates to an electronic casing for electronic boards.

TECHNICAL BACKGROUND

Complex electronic products, such as residential gateways, in particular of the latest generation, comprise numerous energy-intensive components, since they should propose high radiofrequency performance, in particular to achieve a satisfactory sensitivity.

In a thermal context, it is thus known, to discharge calories from these electrical energy-consuming components, to implement dissipaters generally constituted of a base parallel to the electronic board carrying the components to be cooled, vanes extending from the base to ensure a discharging of the heat by convection.

Unfortunately, the different components are generally carried by the same board or by several electronic boards, which are thus carried by a common dissipater. This involves, during the repair, numerous complex operations to separate then reassemble the different pieces of the residential gateway, which is contrary to the repairability and reuse needs of the operational parts.

AIM

An aim of the invention is therefore to propose a more modular electronic casing.

SUMMARY

In view of achieving this aim, an electronic casing is proposed, comprising a box comprising at least one first part and at least one second part, each part forming a distinct container, such that a first electronic board is housed in the first part and such that a second electronic board is housed in the second part, the two parts being integral with one another by at least one conduit shaped to form at least partially an air circulation channel between the two parts of the box, the casing comprising at least one first connector linked to the first electronic board and at least one second connector linked to the second electronic board, the two connectors being in contact with one another through the conduit, at least one zone of the first connector in contact with the second connector being made of an electrically conductive material, and at least one zone of the first connector in contact with the second connector being made of an electrically conductive material, the outside of the conduit moreover being shaped to define at least partially an air circulation channel between the two parts of the box.

In this way, the two parts of the box make it possible to separate the electronic boards associated with each of the parts and thus to make the electronic casing more easily modular.

It is noted that the electronic boards can advantageously remain equipotential, thanks to the contacts of their connectors.

Cleverly, the conduit makes it possible to both enable this equipotentiality and to favour the cooling of the two box parts. This cooling is advantageously natural, thanks to the circulation of air between the two parts of the box.

The two parts of the box can thus comprise electronic boards with distinct functionalities, and which can evolve independently from one another.

In addition, a casing such as described above is proposed, wherein the channel extends along a first face of the first part and along a second face of the second part, the two parts facing one another.

In addition, a casing such as described above is proposed, wherein the first face and the second face are substantially parallel to one another.

In addition, a casing such as described above is proposed, wherein at least one of the two electronic board extends substantially parallel to the first face and/or to the second face.

In addition, a casing such as described above is proposed, wherein the channel is closed, apart from its axial ends.

In addition, a casing such as described above is proposed, wherein the conduit is formed by two conduit sections comprising means for connecting a section to another.

In addition, a casing such as described above is proposed, comprising at least one heat dissipater associated with one of the two electronic boards, the heat dissipater carrying the connector of the corresponding part.

In addition, a casing such as described above is proposed, wherein the connector is a vane of the dissipater.

In addition, a casing such as described above is proposed, comprising at least one connecting member associated with one of the two electronic board, the connecting member carrying the connector of the corresponding part.

In addition, a casing such as described above is proposed, wherein at least one connector is shaped as a tab.

In addition, a casing such as described above is proposed, wherein at least one of the connectors is at least partially elastically deformable.

In addition, a casing such as described above is proposed, wherein one of the connectors is in contact with a lateral side of the other connector.

In addition, a casing such as described above is proposed, wherein the two connectors are temporarily fixed to one another.

In addition, a casing such as described above is proposed, wherein at least one of the connectors extends over the entire width of the associated conduit.

In addition, a casing such as described above is proposed, wherein the casing is a residential gateway.

In addition, a casing such as described above is proposed, wherein the casing is a wireless network extension device.

Other features and advantages will emerge upon reading the following description of particular, non-limiting embodiments.

BRIEF DESCRIPTION OF THE DRAWINGS

The description of particular embodiments refers to the accompanying drawings, among which.

DETAILED DESCRIPTION

Figure 1:
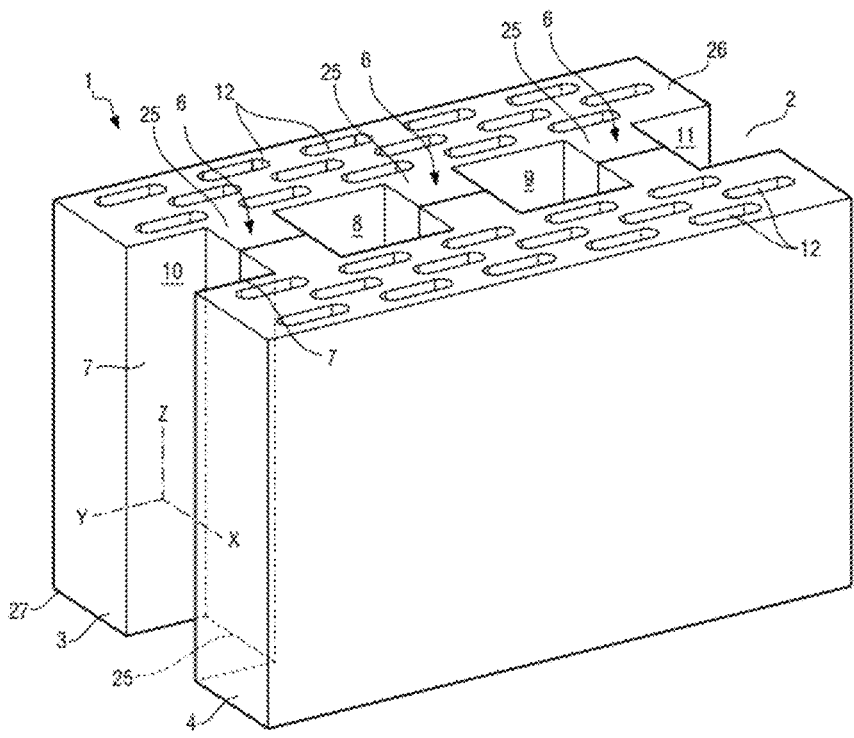
FIG. 1 is a perspective view of an electronic casing according to a first particular embodiment.
Figure 2:
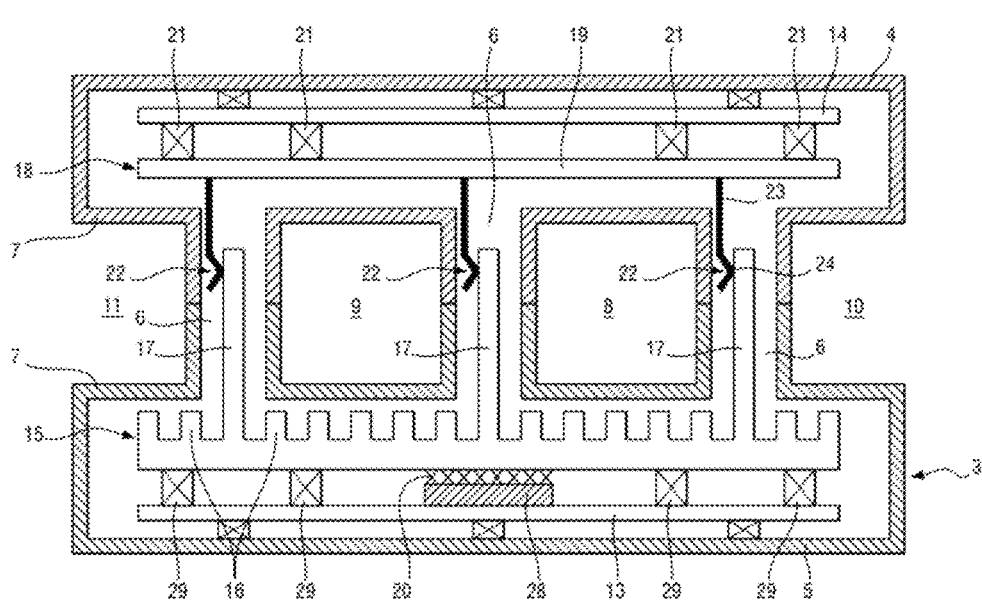
FIG. 2 is a cross-sectional view of the casing illustrated in FIG. 1.
Figure 3:
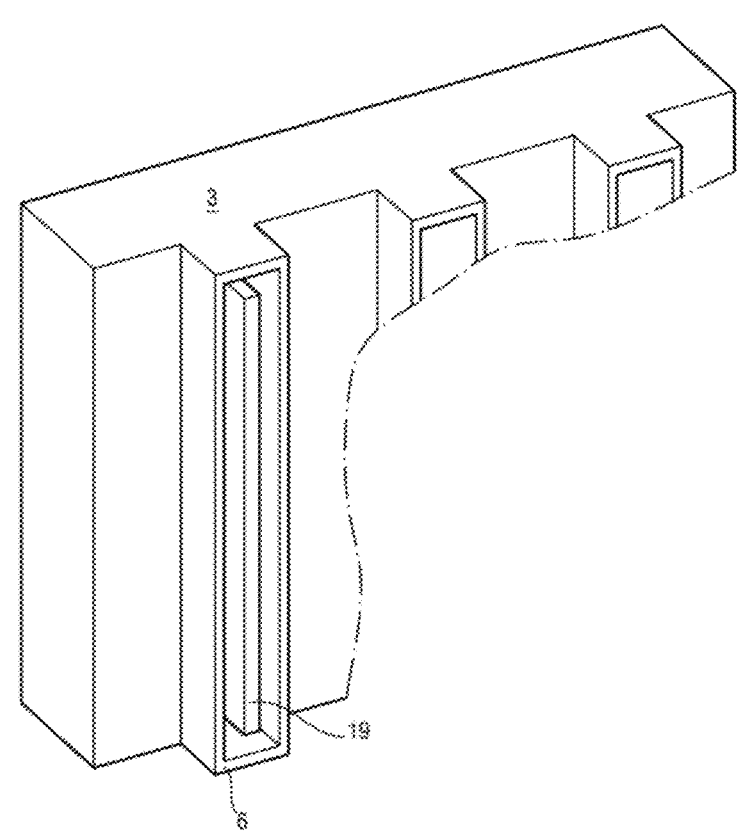
FIG. 3 is a perspective view of a portion of one of the parts of the casing illustrated in FIG. 1.

In reference to FIGS. 1 to 3, an electronic casing 1 according to a first particular embodiment is described.

The casing 1 comprises a box 2 which comprises at least one first part 3 and one second part 4.

The first part 3 and the second part 4 together form the box 2, in this case.

Preferably, the casing 1 is an electronic device proposing at least two distinct functionalities (for example, a first data packet routing and/or extended network access functionality, and a second wireless communication functionality) each being able to be performed by a submodule of the casing 1 (a first submodule being formed by the first part 3 and a second submodule being formed by the second part 4) of said casing 1.

The casing 1 is, for example, a residential gateway or a wireless network extension device (extender).

The box 2 is preferably at least partially made of an electrically insulating material. This material can further contribute to the dissipation of calories. For example, those two parts 3, 4 are made of an electrically insulating material.

In this non-limiting example, the two parts 3, 4 are identical in this case, the following description of the first part 3 therefore also applies to the second part 4. In other examples, the two parts 3, 4 are not identical, as illustrated below, by FIGS. 9*a*, 9*b*, 9*c.*

The first part 3 comprises a plate 5. The plate 5 is closed and hollow, in this case. The plate 5 thus forms a closed container.

The first part 3 moreover comprises at least one conduit section 6, and for example, at least two conduit sections 6, and for example, at least three conduit sections 6. The conduit sections 6 are all hollow, so as to open out to each of their axial ends. At least one conduit section 6 extends, so as to open out to its first axial end inside the plate 5, its second axial end moreover being free.

The first part 3 is therefore hollow.

At least one conduit section 6 extends from the plate 5 outwards from the first part 3 (in the direction of the second part 4, when the two parts 3, 4 are integral with one another). At least one conduit section 6 extends from a joining face 7 of the plate 5 (that is a face of the first part 3 rotated towards the second part 4 when the two parts 3, 4 are integral with one another). Preferably, the joining face 7 is flat and extends in a normal plane to a first axis X, the plane thus being defined by a second axis Y and a third axis, both perpendicular to the first axis X, the third axis Z moreover being perpendicular to the second axis Y.

At least one conduit section 6 extends rectilinearly along the first axis X outwards from the first part 3 (in direction of the second part 4 when the two parts 3, 4 are integral with one another).

Preferably, the different conduit sections 6 all extend from the same face of the plate 5 and preferably also from the same joining face 7 of the plate 5. Preferably, the different conduit sections 6 are identical to one another. Preferably also, the different conduit sections 6 extend parallel to one another to the first axis X.

The cross-section of at least one of the conduit sections 6 (along a normal section plane along the third axis Z) is of any shape, and for example, rectangular, square, etc.

In the present case, at least one conduit section 6 also extends rectilinearly along the third axis Z along the joining face 7. At least one conduit section 6 extends, in this case, longitudinally along the third axis Z. Said conduit section 6 extends, for example, over the entire dimension of the joining face 7 (dimension of the joining face considered along the third axis Z). Said conduit section 6 is, in this case, arranged so as to extend into the continuity of a first face 26 of the first part 3 adjacent to the joining face 7 and so as to extend into the continuity of a second face 27 of the first part 3 adjacent to the joining face 7 and opposite the first face. The longitudinal ends 25 (along the third axis Z) of the conduit section 6 are closed. The conduit section 6 therefore forms, by its longitudinal ends 25, a continuous plane with the faces adjacent to the joining face 7.

As already indicated, its axial ends (along the first axis X) are open. The container formed by the plate 5 thus opens outwards from the first part 3 only by way of its conduit sections 6 and their axial ends.

Optionally, the first part 3 and/or the second part 4 can comprise aeration orifices 12 (only one part of which is referenced, in this case) on one or more of its faces and, for example, on one or more of its faces other than its joining face 7. For example, aeration orifices 12 can be provided on two faces facing the first part 3 and/or the second part 4, to ensure an air circulation inside the part in question.

In this case, each container is closed, but communicates with the other container via the conduit sections 6 and with the outside, the associated aeration orifices 12. Therefore, these are small openings, and not wide cutouts of the container.

The cross-section of at least one of the conduit sections 6 (along a normal cross-sectional plane the first axis X) is of any shape, and for example, rectangular, square, etc.

The conduit sections 6 are arranged at regular intervals along the joining face 7 (along the second axis Y).

At least one of the conduit sections 6 and preferably, all the conduit sections 6 are made of one single part with the plate 5.

When the first part 3 and the second part 4 are assembled, each conduit section 6 of the first part 3 preferably extends into the extension of a conduit section 6 of the second part 4. Preferably, each conduit section 6 of the first part 3 extends coaxially to the conduit section 6 facing the second part 4 (and, in this case, coaxially to the first axis X).

Subsequently, the conduit sections 6 of the first part 3 and the conduit sections of the second part 4 together make general conduits connecting the first part 3 to the second part 4 and more specifically, the plate 5 of the first part 3 to the plate 5 of the second part 4 and more specifically also, the container of the first part 3 to the container of the second part 4.

Thus, the two containers 3, 4 are closed vis-à-vis the outside of the box 2, but communicate together via the conduits.

Preferably, the two conduit sections 6 are provided with their engagement means, so as to ensure an embedding of the section of one of the parts to a section facing the other of the parts (by interlocking, by clipping, etc.).

The first part 3 and the second part 4 are thus removably assembled together.

A first conduit 6 thus formed by the assembly of the first part 3 and of the second part 4 makes, with a second adjacent conduit 6 and the two joining faces 7 carrying them, an air circulation channel between the two parts 3 and 4. More specifically, the casing 1 represented in FIGS. 1 and 2 comprises three conduits 6 which define, in pairs, a first air circulation channel 8 and a second air circulation channel 9.

The channels 8 and 9 each fulfil an air circulation function. Said channels 8, 9 are identical, in this case. The following description of the first channel 8 is therefore also applicable, in this case, to the second channel 9. Alternatively, the channels 8 and 9 can be non-identical and thus each have different arrangements and/or shapes and/or different dimensions.

The first channel 8 extends longitudinally parallel to the third axis Z. The first channel 8 extends rectilinearly parallel to the third axis Z. The first channel 8 thus extends parallel to the two joining faces 7.

The first channel 8 moreover extends, in this case, over the entire width of said two joining faces 7 (width considered along the third axis Z).

The first channel 8 thus forms an air gap between the first part 3 and the second part 4.

This air gap in particular acts as thermal insulation between the first part 3 and the second part 4. The second part 4 is typically better preserved from dissipated calories by the first part 3, thanks to this air gap, and reciprocally.

This air gap further facilitates an air circulation between the two parts 3, 4 according to a "funnel" effect. Indeed, air circulates in the channel 8 from the first axial end of the box 2 to its second opposite axial end. This air circulation through the channel 8 favours the dissipation of heat on the surface of the joining faces 7 by convection. This makes it possible to cool the two joining faces 7 and by that, the associated containers.

The shape of the cross-section of the first channel 8 (normal along the third axis Z) is dependent on the shapes of the conduits 6 and the shapes of the joining faces 7. The cross-section of the first channel 8 can thus be any shape, for example square or rectangular, etc.

The first channel 8 moreover opens outwards from the box 2 only at its two axial ends (along the third axis Z).

It is noted that the conduits moreover define, on the sides of the box 2, a first (air circulation) end channel 10 and a second (air circulation) end channel 11, which are themselves semi-open outwards at one of their sides.

This is due to the fact that the end channels 10, 11 are only delimited by one single conduit 6 and not two.

These end channels 10, 11 however contribute also actively to the cooling of the box 2.

According to another aspect, the casing 1 comprises a first electronic board 13 arranged in the first container and a second electronic board 14 arranged in the second container.

The box 2 is shaped such that the two electronic boards 13, 14 extend parallel to one another.

The box 2 is shaped, such that at least one of the electronic boards 13, 14 extend parallel to the joining face 7 of the part of the associated box 2. Said electronic board 13, 14 thus has two main faces, both extending into planes parallel to that containing the second axis Y and the third axis Z. The channels 8, 9, 10, 11 thus extend parallel to said electronic board 13, 14.

For example, at least one of the electronic boards 13, 14 is fixed to one or more internal walls of the associated plate 5 (for example, by clipping, interlocking, screwing, bonding, soldering, welding, etc.). Preferably, said electronic board 13, 14 is fixed to internal walls of said plate 5 which are not those associated with the joining face 7.

Preferably, at least one of the electronic boards, and for example, the first electronic board 13, is associated with at least one dissipater 15 like for example an heat dissipater (or heat sink).

The dissipater 15 comprises, in a manner known per se, a base having a first main face provided with vanes 16 (only one part of which is referenced, in this case), and a second main face opposite the first main face. The second main face, in this case, has no vanes and is preferably smooth.

The vanes 16 mainly extend perpendicularly to the first main face. The vanes 16 all mainly extend parallel to one another. Different arrangements and/or different shapes and/or different dimensions and/or different materials of the vanes 16 are possible for at least two vanes in question.

The dissipater 15 is at least partially made of a thermally conductive material.

Indeed, the dissipater 15 must be thermally conductive to ensure a good circulation of the calories to be discharged from the components 28 (only one being represented, in this case) present on the first associated electronic board 13.

Preferably also, the dissipater 15 is at least partially made of an electrically conductive material.

Indeed, the dissipater 15 must be at least partially electrically conductive, to ensure its electrical equipotentiality regarding electronic signals implemented in the first associated electronic board 13.

These two conduction features can be native to the material chosen for the dissipater 15 or, be the combination of at least two materials.

The dissipater 15 can, for example, be made of aluminium or be aluminium-based (extruded, injected, etc.), made of copper or be copper-based, or made of any other metal material. It can also, at least partially, be electrically insulating material-based or made of electrically insulating material (for example, made of plastic material or be plastic material-based), and moreover be, covered at least partially, with a paint, a varnish and/or any other coating made of electrically conductive material.

The dissipater 15 is mechanically connected to the first electronic board 13 and, for example, fixed to the first electronic board 13 (by screwing, clipping, interlocking, soldering, bonding, welding, etc.).

Moreover, the dissipater 15 is thermally connected to the first electronic board 13, and in particular, to the components 28, by at least one specific connection. For example, the specific connection comprises at least one arm 20 made of thermally conductive material is fixed at a first end to the first electronic board 13 (via one of the components 28) and at a second end to the dissipater 15. Said arm 20 can therefore also serve as a mechanical connection between the dissipater 15 and the first electronic board 13.

Moreover, the dissipater 15 is electrically connected to the first electronic board 13 by at least one specific connection 29, in order to ensure an equipotentiality between the dissipater 15 and the first electronic board 13. Said connection 29 can be common or not to the abovementioned thermal connection. The arm 20 can therefore also be used as an electrical connection.

Preferably, the dissipater 15 is arranged so as to extend parallel to the first electronic board 13. The two main faces of the dissipater 15 thus extend parallel to the plane containing the second axis Y and the third axis Z. In the present case, the dissipater 15 thus also extends parallel to the joining face 7.

Preferably also, the second main face of the dissipater 15 is the one rotated towards the first electronic board 13, the first main face (the one carrying the vanes 16) being rotated towards the joining face 7.

The first electronic board 13 is arranged closest to the bottom of the plate 5, such that the dissipater 15 is itself arranged between the first electronic board 13 and the ceiling of the plate 5, wherein the conduit sections 6 from the first part 3 open out.

When the first electronic board 13 and the dissipater 15 are arranged in the first part 3, the vanes 16 extend parallel to the first axis X. The vanes 16 thus extend rectilinearly parallel to said first axis X. The vanes 16 thus extend in the direction of the second part 4.

At least one vane 16 is of a length such that it extends up to substantially the ceiling of the plate. At least one vane, called main vane 17, has a greater length and thus extends inside one of the conduit sections 6. Preferably, for each conduit section 6 of the first part 3, the dissipater 15 comprises a main vane 17. The different main vanes 17 are all identical, in this example. In other examples, they can be different in their shapes and/or their arrangements and/or their dimensions and/or their materials, for at least two main vanes in question. The different main vanes 17 mainly extend parallel to one another in each of the attributed conduit sections 6. At least one of said vanes 17 is of a length (along the first axis X), such that it extends beyond the conduit section 6 of the first part 3, so as to also extend into the conduit section 6 facing the second part 4 when the two parts 3, 4 are assembled. The free end of said main vane 17 extends, in this case, into the conduit section 6 of the second part 4.

The main vanes 17 are, in this case, platelet-shaped. Each main vane 17 thus comprises two main faces, which extend parallel to a plane containing the first axis X and the third axis Z. Each main vane 17 therefore has one same height (along the first axis X) which is the same over its entire length (along the third axis Z). For example, each main vane 17 extends, in this case, substantially over the entire length (along the third axis Z) of the associated conduit section 6.

The main vanes 17 advantageously play an additional role, in addition to that of ensuring a heat dissipation. Indeed, said main vanes 17 act as an electrical connector for the first part 3, which will engage with corresponding electrical connectors of the second electronic board 14 which will be described below. The contact by each pair of connectors ensures an electrical coupling between the two electronic boards 13, 14 and therefore an equipotentiality between said boards.

The main vanes 17 ensuring an electrical contact with the connectors facing the second part 4, the main vanes 17 are preferably provided at least partially with a surface ensuring a reliable electrical contact with said facing connectors. Said surface is, for example, created by depositing a paint, a varnish or any other electrically conductive coating on at least one contact zone of the main vane 17 in question with the facing connector.

Optionally, the second electronic board 14 is not associated with a heat dissipater.

However, the second electronic board 14 is, in this case, connected to a connecting member 18.

Preferably, the connecting member 18 comprises a baseplate 19 arranged as to extend parallel to the second electronic board 14.

The baseplate 19 has the role of ensuring an equipotentiality at least at the main face of the second electronic board 14 facing the connecting member 18.

The baseplate 19 is at least) partially made of an electrically conductive material. For example, the baseplate 19 is made of aluminium or is aluminium-based (extruded, injected, etc.), made of copper, made of steel, or made of any other metal material. It can also at least partially be electrically insulating material-based, or made of electrically insulating material (for example, made of plastic material or be plastic material-based) and moreover be covered, at least partially, with a paint, with a varnish and/or any other coating made of electrically conductive material.

Typically, the baseplate 19 is plate-shaped. The baseplate 19 therefore comprises a first main face and a second main face opposite the first main face.

The two main faces of the baseplate 19 thus extend parallel to the plane containing the second axis Y and the third axis Z. In the present case, the baseplate 19 thus also extends parallel to the joining face 7.

Preferably also, the second main face of the baseplate 19 is the one rotated towards the second electronic board 14, the first main face being rotated towards the joining face 7.

The second electronic board 14 is arranged closest to the bottom of the plate 5, such that the connecting member 18 is itself arranged between the second electronic board 14 and the ceiling of the plate 5, wherein the conduit sections 6 of the second part 4 open out.

The connecting member 18 is mechanically connected to the second electronic board and, for example, fixed to the second electronic board 14 (by clipping, interlocking, screwing, soldering, bonding, welding, etc.). Optionally, the connecting member 18 is further mechanically connected to one or more internal walls of the plate 5 of the second part 4, and for example, fixed to the or said internal walls (by clipping, interlocking, screwing, soldering, bonding, welding, etc.).

Moreover, the connecting member 18 is electrically connected to the second electronic board 14 by at least one specific connection in order to ensure an equipotentiality between the connecting member 18 and the second electronic board 14. For example, an arm 21 made of electrically conductive material is fixed at a first end to the second electronic board 14 and at a second end to the connecting member 18. Said arm 21 therefore, in this case, also serves as the mechanical connection of the connecting member to the second electronic board 14.

Optionally, the connecting member 18 is, in this case, also thermally connected to the second electronic board 14 by at least one specific connection. Said connection can be common or not to the abovementioned electrical connection. The arm 21 can therefore also be used as a thermal connection. Moreover, the connecting member 18 comprises at least one of the abovementioned connectors 22, which extends from the baseplate 19, and more specifically, in this case, from the first main face of the baseplate 19.

The connectors 22 extend, in this case, perpendicularly to the first main face. The connectors 22 all extend parallel to one another.

When the second electronic board 14 and the connecting member 18 are arranged in the second part 4, the connectors 22 extend parallel to the first axis X. The connectors 22 thus extend rectilinearly parallel to said first axis X. The connectors 22 thus extend in the direction of the first part 3.

Preferably, for each conduit section 6 of the second part 4, the connecting member 18 comprises at least one connector 22 extending into said conduit section 6. The different connectors 22 are all, in this case, identical in this example. In other examples, the different connectors 22 can each be of different shapes and/or dimensions and/or of different arrangements. The different connectors 22 mainly extend parallel to one another in each of the attributed conduit sections 6. The free end of at least one of the connectors 22 (and, in this case, of all the connectors 22) extends into the conduit section 6 of the second part 4.

The baseplate 19 and the connectors 22 are assembled to one another—for example, by riveting, heading, welding, or any other method. They can also be made of one single part—worked, for example, by folding, extrusion, stamping or any other method.

At least one of the connectors 22 is tab-shaped. The tab being shaped so as to comprise a strut 23, a first end of which is integral with the baseplate 19 and a second end of which is extended by a hook 24. The hook 24 and the strut 23 are preferably made of one same part.

Preferably, at least one of the connectors 22 is shaped to be able to be elastically deformed, relative to the baseplate 19. Preferably, the strut 23 and/or the hook 24 is thus shaped to be able to be elastically deformed relative to the baseplate 19.

At least one of the connectors 22 is at least partially made of metal or is metal-based, and preferably at least partially made of a metal or is with the basis of a metal, which is sufficiently flexible to enable an elastic deformation of at least one part of said connector 22. The connector 22 is thus at least partially made of steel, stainless steel, etc., or is steel-, stainless steel-based, etc.

At least one of the connectors 22 is obtained by folding or stamping (for example, a flexible strip), by pressurising a spring, etc.

When the casing 1 is assembled, each hook 24 bears against one of the main vanes 17 and more specifically, in this case, bears against the surface of the main vane 17 treated to ensure a better electrical connection.

Therefore, there is a specific electrical contact between each tab/vane pair and thus, an electrical contact between the connecting member 18 (and by that, the second electronic board) and the dissipater 15 (and by that, the first electronic board 13).

The elastically deformable tab of the connectors 22 makes it possible:

to improve the contact between the main vane 17 and the tab, and/or
  to compensate a possible alignment defect between the main vane 17 and the tab and/or between the two sections of one same conduit.

There can be one single tab associated with each main vane 17 or have several tabs associated with each main vane 17. In the latter case, the group of tabs will be such that the tabs of said group will extend separated from one another in the conduit section 6 of the second part 4 along the third axis Z.

In the present case, at least one of the tabs is in contact with the associated main vane 17—on a lateral side of said vane 17 (in this case, one of the main faces of the main vane 17).

Subsequently, the tab tends to slide along the main vane 17 during the securing of the two parts 3, 4 of the box 2.

This also makes it possible to ensure a mechanical guiding between the connecting member 18 and the dissipater 15 during the assembly of the two parts of the box 2.

Thus, in service, when the two parts 3, 4 of the box 2 are assembled together, the same movement occurs, ensuring a contact between the connectors 22 of the first part 3 (the main vanes 17) and those of the second part 4 (the tabs). In this way, an equipotentiality is ensured between the two parts 3, 4 of one same casing 1, and this, relatively simply and easily.

Advantageously, there is a physical separation between the two parts 3, 4 (apart from the junction between the conduit sections 6) and therefore a separation of the heat dissipation properties of each of the parts 3, 4.

It is noted, in particular, that the contact between a main vane 17 of the first part 3 and a connector 22 of the second part 4 is almost specific. Furthermore, the elasticity functionality of the connector 22 of the second part 4 involves the use of a relatively thin connector 22. Subsequently, this results in a significant thermal impedance, which considerably blocks the transmission of the calories from the dissipater 15 to the connecting member 18. Thus, the transmission of heat by conduction from the components of the first electronic board 13 to the second electronic board 14 is very limited. Therefore, the most energy intensive electronic components can be arranged on the first electronic board 13.

The casing 1 thus described has a good modularity by comprising parts 3, 4 which are easily separable, equipotential and thermally insulated from one another. Subsequently, the casing 1 can contain electronic boards with different functions. Thus, an electronic board can be easily replaced by another, which makes it possible to ensure a development of the functionalities in the casing 1 without changing all of its elements.

Naturally, the casing 1 can have a shape other than that described. For example, the number and/or the shape of the vanes 16, 17 can be different from what has been indicated.

Figure 4:
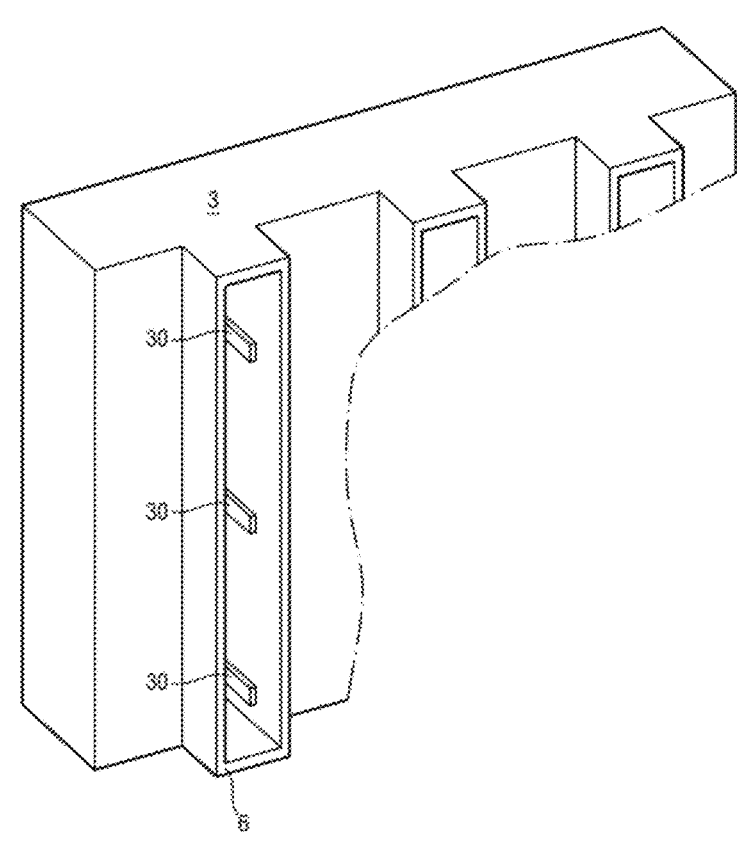
FIG. 4 illustrates a first variant of the casing illustrated in FIG. 1.

Thus, at least one of the main vanes 17 cannot have the same height (along the first axis X) over its entire length (along the third axis Z). For example, the main vane 17 can be deployed up to the contact point with the tab only facing said tab. In reference to FIG. 4, the main vane 17 can thus have a base (optionally combined with the base of the dissipater 15) from which at least one pin 30 extends into the facing conduit section 6 and, for example, at least two pins 30 spaced apart from one another along the third axis Z. For example, the at least two pins 30 are identical to one another. For example, the at least two pins 30 extend parallel to one another and to the first axis X. For example, one of the pins 30 is associated with one of the connectors 22 of the facing part.

Figure 5:
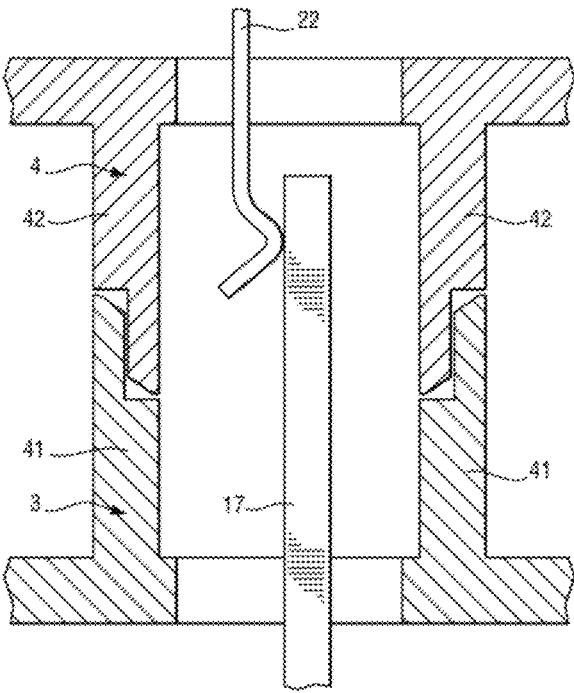
FIG. 5 illustrates a second variant of the casing illustrated in FIG. 1.

Thus, although, in this case, the free ends of the conduit sections 6 of each of the parts are flat, said free ends can be of a more complex shape. Thus, a free end of a conduit section 6 of the first part 3 and a free end of a conduit section 6 of the second facing part 4 can comprise for one, a connecting portion 41 and for the other, a connecting portion 42, the two connecting portions 41, 42 being embedded in one another during the assembly of the two parts 3, 4 to fix the two parts 3, 4 together. Furthermore, this will ensure a guiding between the two parts 3, 4. The pair of connecting portions 41, 42 is, for example, chosen from among the following list: tenon/mortise, frame/rabbet, pin/hole, ridge/female slider, etc. Such a connection is, for example, illustrated in FIG. 5.

Figure 6:
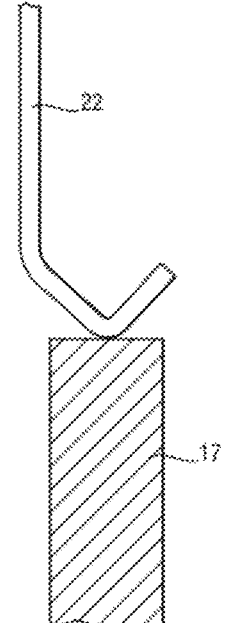
FIG. 6 illustrates a third variant of the casing illustrated in FIG. 1.

Thus, at least one of the tabs can be in contact (physical and/or electrical) with the main vane 17 associated with a portion of the main vane 17 other than its lateral face. In reference to FIG. 6, the tab can be in contact (physical and/or electrical) with the main vane 17 at the free upper face of said main vane 17. The tab thus does not slide along the main vane 17 during the assembly of the two parts 3, 4 together, but is rather retracted, bearing against said vane. The tab this tends to push the main vane 17 to the dissipater 15.

Figure 7:
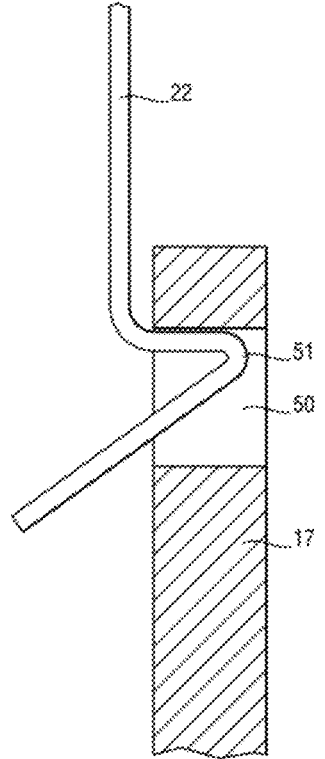
FIG. 7 illustrates a fourth variant of the casing illustrated in FIG. 1.

Thus, at least one of the tabs cannot be simply in contact with the associated main vane 17, but be temporarily integral with said vane 17 (by clipping, by interlocking, etc.). This makes it possible, for example, to hold the tab in position in the main vane 17 (or vice versa), and therefore to ensure a good electrical contact between the two, even in case of vibration or of any other event tending to separate the two parts 3, 4 from one another. In reference to FIG. 7, the main vane 17 comprises, for example, a space or an orifice 50, wherein a projecting part 51 of the associated connector 22 is embedded during the securing of the two parts 3, 4 together.

Figure 8:
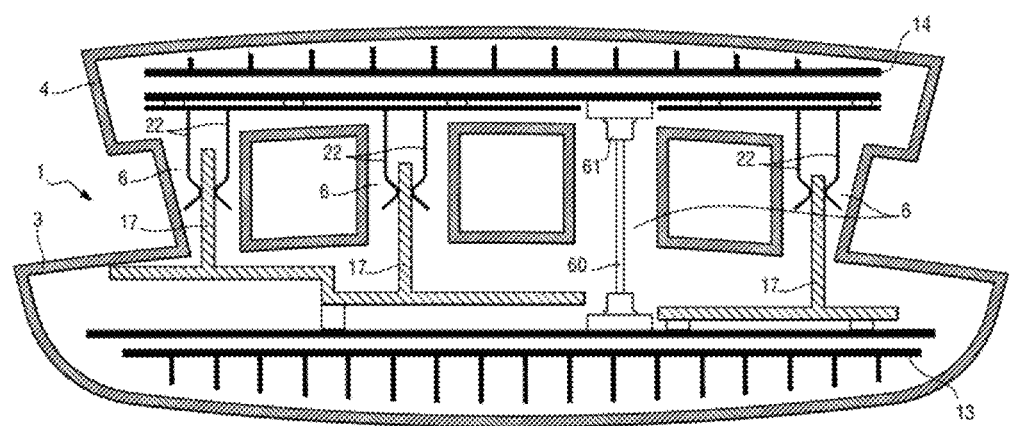
FIG. 8 is a schematic, cross-sectional view of an electronic casing according to a second particular embodiment.

Thus, the two parts 3, 4 of the cover can have a shape other than that indicated, and be, for example, more rounded than what has been described. FIG. 8 thus illustrates another box 2 shape.

Although, in this case, there was necessarily at least one electrical coupling for the equipotentiality between a connector linked to the first electronic board 13 and a connector linked to the second electronic board 14 through one of the conduits, the casing 1 can be shaped such that no coupling occurs in at least one of the conduits, or such that another type of coupling, other than an electrical coupling for the equipotentiality occurs through one of the conduits. FIG. 8 thus proposes, that through one of the conduits 6, an electronic coupling is performed by the connection of at least one bus 60 linked to the first electronic board 13 to at least one bus 61 linked to the second electronic board 14.

For example, the at least one bus 60 and the at least one bus 61 enable the data exchange and communication (control data and/or useful data) between the first electronic board 13 and the second electronic board 14. This data exchange and communication is conventionally performed by a communication link, which is, for example, electrical/electronic. In this scenario, at least one of the other conduits 6 ensure an equipotentiality coupling via the engagement of a main vane 17 and of the connector 22. This equipotentiality obtained makes it possible, for example, to ensure an equipotential ground plane of the electronic boards 13, 14 to control the interfering electromagnetic noise, which could be amplified by parts left electrically floating.

Figure 9A:
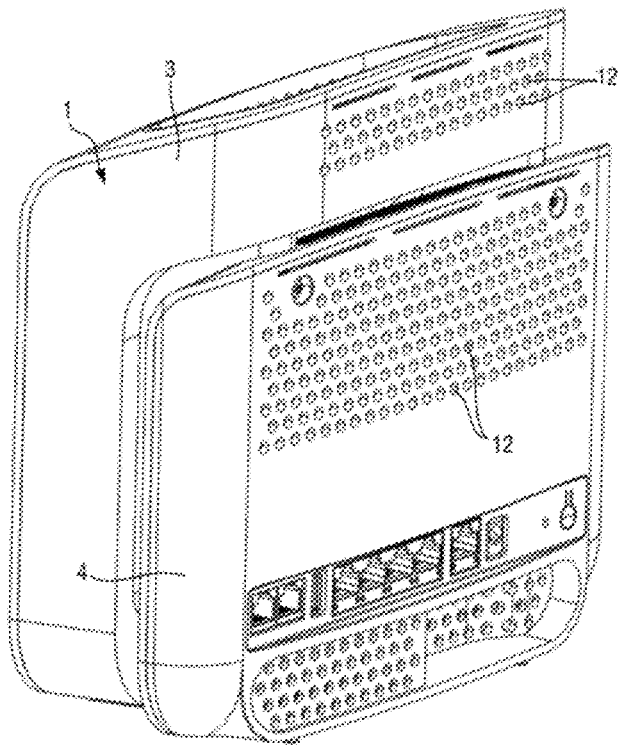
FIG. 9*a* is a perspective view of an electronic casing according to a third particular embodiment.
Figure 9B:
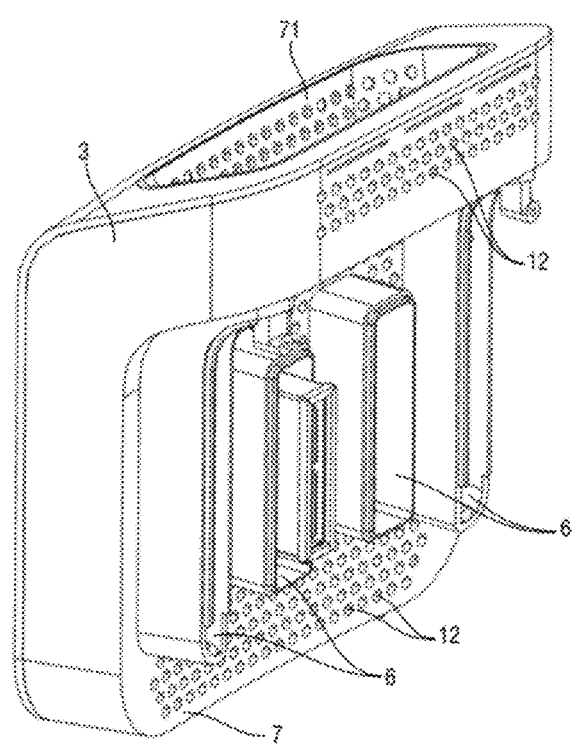
FIG. 9*b* is a perspective view of a part of the electronic casing represented in FIG. 9*a,*
Figure 9C:
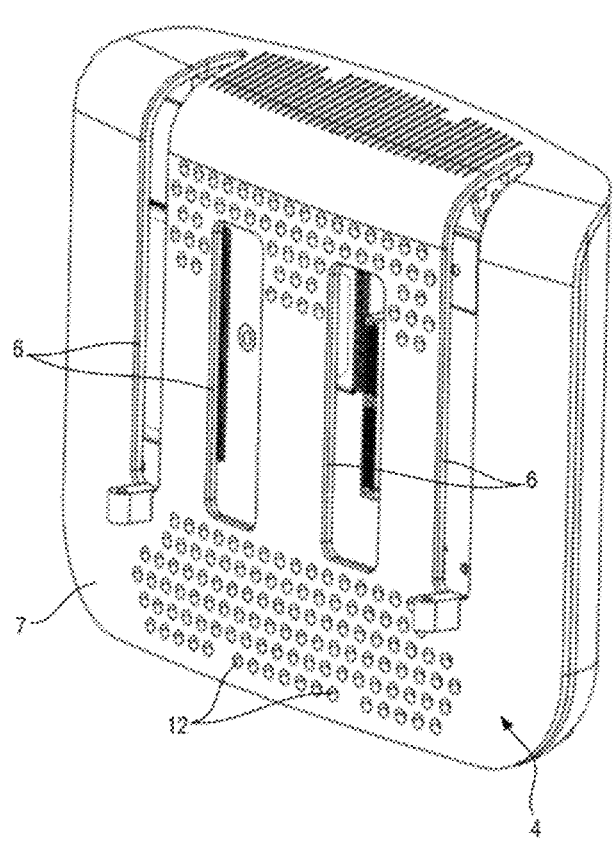
FIG. 9*c* is a perspective view of another part of the electronic board represented in FIG. 9*a.*

Thus, although, in this case, the two parts 3, 4 are identical, the two parts 3, 4 can be different. As illustrated in FIGS. 9a, 9b and 9c, one of the parts can be of larger dimensions and cover at least partially the other of the parties. The box 1 can thus comprise at least one general conduit 71, wherein several conduits 6 such as described above open out. For example, the part (the first part 3 or the second part 4) of larger dimensions can solely form the general conduit 71, wherein the secondary conduits 6 formed by the assembly of the first part 3 and of the second part 4 opens out.

Optionally, the first part 3 and/or the second part 4 can also comprise aeration orifices 12 (only one part of which is referenced, in this case) on one or more of its faces and, for example, on its joining face and/or on one or more of its faces other than its joining face 7.

Naturally, the aim of the invention is not limited to the embodiments described, but includes all variants entering into the field of the aim, such as defined by the claims.

The casing can comprise a cowling covering the box to conceal it at least partially. The cowling can be made of plastic material, for example.

The shape and/or the number of parts forming the box can be different from what has been indicated. The box can thus comprise more than two parts and, for example, three parts.

The number and/or the shape of the conduits can be different from what has been indicated.

The number and/or the shape of the air circulation channels can be different from what has been indicated. For example, the casing will be shaped, such that the two parts are spaced apart from one another (along the first axis X) by a spacing of several millimetres making it possible to form an air gap, sufficient for the thermal insulation between the two parts. For example, the casing will be shaped, such that the two parts are spaced apart from one another (along the first axis X) by a spacing of 5 to 20 millimetres, and for example, 10 to 15 millimetres. This is particularly advantageous for a good thermal insulation between the two parts for the case where one of them dissipates around 20 Watts.

The number and/or the shape of the electronic boards can be different from what has been indicated.

The number and/or the shape of the tabs can be different from what has been indicated.

The number and/or the shape of the vanes can be different from what has been indicated. At least one of the main vanes can be in contact with a tab on a first of its main faces and with another tab (or the same) on the second of its main faces as represented in FIG. 8.

Although, in this case, at least one main vane is provided with an additional coating to ensure a good electrical contact, the main vane can, on the contrary, have a zone with a lesser coating than the adjacent zones to ensure a reliable electrical contact (for example, this specific zone can be created by scraping, polishing, saving, or any other method). Typically, in the case of a main aluminium vane, it will be considerable to have such a zone, which thus has no alumina oxide, a natural electrical insulator. Alternatively, at least one of the main vanes can be provided with a specific device to ensure good electrical contact with the facing tab. The device can thus be, for example, a metal part fixed to the main vane. This part can be attached by riveting, heading, welding, or any other means.

The number and the distribution of connectors between the two parts of the box will preferably be defined to ensure an equipotentiality which is suitable for the performance of the casing. For example, to ensure a correct equipotentiality between two electronic boards implementing rapid PCIe (Peripheral Component Interconnect Express)-type signals, routed over either of the electronic boards, it will be preferred to ensure one contact point every 12 centimetres squared, and for example, every 10 centimetres squared of a main face associated with the first electronic board (for example, that of a heat dissipater), and correspondingly, a facing main face, associated with the second electronic board (for example, that of a connecting member).

The connecting member can itself be a heat dissipater, the connectors of the second part thus being main vanes or having any other shape ensuring at least the electrical contact with the connectors of the other facing part. The second part can comprise a heat dissipater in addition to its connecting member.

Correspondingly, the first part can comprise a connecting member instead of a heat dissipater, the connectors of the first part thus being tabs or having any other shape ensuring at least the electrical contact with the connectors of the other facing part. The first part can comprise a connecting member in addition to its heat dissipater.

The facing connectors cannot be vane/tab pairs, but be shaped differently.

The heat dissipater and/or the connecting member can form an integral part of the associated electronic board.

The heat dissipater can comprise only main vanes. The heat dissipater can comprise vanes (main or not) on its two main faces.

Although, in this case, the section of the first part and that of the second part is of the same length (along the third axis X), one of the sections can be of a greater length than the other. One single part can comprise all of the conduit which thus is directly embedded in the other corresponding part.

The box can have only one single conduit which will thus define on either side, two semi-open air circulation channels on the outside.

The box cannot be made of a thermally insulating material, or cannot be fully made of an electrically insulating material. The box can thus be at least partially, for example, made of metal-based material or of metal material, which will facilitate the discharging of the calories outside of the box.

The invention claimed is:

1. An electronic casing comprising a box comprising at least one first part and at least one second part, each part forming a distinct container, such that a first electronic board is housed in the first part and such that a second electronic board is housed in the second part, the two parts being integral with one another by at least one conduit, the casing comprising at least one first connector linked to the first electronic board and at least one second connector linked to the second electronic board, the two connectors being in contact with one another through the inside of the conduit, at least one zone of the first connector in contact with the second connector being made of an electrically conductive material and at least one zone of the second connector in contact with the first connector being made of an electrically conductive material, the outside of the conduit being moreover shaped to define at least partially an air circulation channel between the two parts of the box, the casing comprising at least one heat dissipater associated with one of the two electronic boards, the heat dissipater carrying the connector of the corresponding part.

2. The electronic casing according to claim 1, wherein the air circulation channel between the two parts of the box extends along a first face of the first part and along a second face of the second part, the two parts facing one another.

3. The electronic casing according to claim 2, wherein the first face and the second face are substantially parallel to one another.

4. The electronic casing according to claim 2, wherein at least one of the two electronic boards extends substantially parallel to the first face and/or to the second face.

5. The electronic casing according to claim 1, wherein the channel is closed, apart from its axial ends.

6. The electronic casing according to claim 1, wherein the conduit is formed by two conduit sections comprising means for connecting from one section to another.

7. The electronic casing according to claim 1, wherein the connector is a vane of the dissipater.

8. The electronic casing according to claim 1, comprising at least one connecting member associated with one of the two electronic boards, the connecting member carrying the connector of the corresponding part.

9. The electronic casing according to claim 1, wherein at least one connector is tab-shaped.

10. The electronic casing according to claim 1, wherein at least one of the connectors is at least partially elastically deformable.

11. The electronic casing according to claim 1, wherein one of the connectors is in contact with a lateral side of the other connector.

12. The electronic casing according to claim 1, wherein the two connectors are temporarily fixed to one another.

13. The electronic casing according to claim 1, wherein at least one of the connectors extends over the entire width of the associated conduit.

14. The electronic casing according to claim 1, wherein the casing is a residential gateway.

15. The electronic casing according to claim 1, wherein the casing is a wireless network extension device.

* * * * *